Figure 1A:
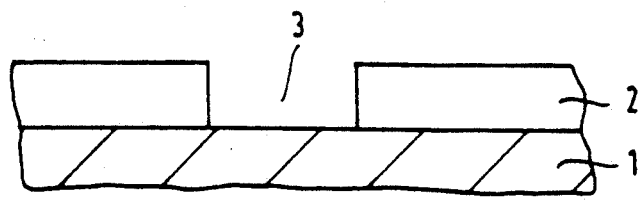

United States Patent [19]

van der Putten et al.

[11] Patent Number: 5,198,389

[45] Date of Patent: Mar. 30, 1993

[54] METHOD OF METALLIZING CONTACT HOLES IN A SEMICONDUCTOR DEVICE

[75] Inventors: Andreas M. Th. P. van der Putten; Johannes W. G. DeBakker, both of Eindhoven; Johannes M. G. Rikken, Oss, all of Netherlands

[73] Assignee: U.S. Philips Corp., New York, N.Y.

[21] Appl. No.: 834,046

[22] Filed: Feb. 10, 1992

[30] Foreign Application Priority Data

Feb. 12, 1991 [NL] Netherlands ............... 9100241

[51] Int. Cl.⁵ .................................. H01L 21/288
[52] U.S. Cl. ............................. 437/190; 437/192; 437/195; 437/230; 427/98
[58] Field of Search ............ 437/230, 190, 192, 195; 427/98, 304, 305, 306

[56] References Cited

U.S. PATENT DOCUMENTS

| | | | |
|---|---|---|---|
| 4,268,536 | 5/1981 | Beckenbaugh et al. | 437/230 |
| 4,293,591 | 10/1981 | Feldstein | 427/97 |
| 4,804,559 | 2/1989 | Ushio et al. | 427/96 |
| 5,063,169 | 11/1991 | De Bruin et al. | 437/41 |
| 5,112,448 | 5/1992 | Chakravosty | 437/192 |

FOREIGN PATENT DOCUMENTS 1-144653  6/1989  Japan ................... 437/230

OTHER PUBLICATIONS

Ting, C.H., et al., "Selective Electroless Metal Deposition . . . ", *J. Electrochem. Soc.*, vol. 136, No. 2, Feb. 1989, pp. 462–466.

Primary Examiner—T. N. Quach
Attorney, Agent, or Firm—Steven R. Biren

[57] ABSTRACT

A TiW layer (14 and 14') between a nickel plug (16 and 16') and a silicon substrate (1) of a semiconductor device precludes the formation of nickel silicides. The nickel plugs are formed by means of an electroless nickel bath to which stabilizers are added which ensure that the contact holes (13 and 13') are filled with nickel right up to the edge.

4 Claims, 2 Drawing Sheets

METHOD OF METALLIZING CONTACT HOLES IN A SEMICONDUCTOR DEVICE

The invention relates to a method of manufacturing a semiconductor device comprising a silicon substrate and a dielectric layer which is provided thereon and in which contact holes are etched down to the silicon, after which palladium nuclei are provided in the contact holes and, next, metal plugs are formed in said contact holes by means of an electroless metallization bath, which plugs contact the silicon.

Semiconductor devices, in particular integrated circuits (ICs), comprise a large number of transistors and other components (capacitors, resistors) which are interconnected electrically. Metal-oxide semiconductor field-effect transistors (MOSFETs) are used on a large scale in VLSI (very large scale integration) devices. In said application, the source and drain regions of a silicon substrate are provided with metal contact plugs which are formed in etched contact holes in a thin $SiO_2$ layer on the silicon substrate. The metal plugs and, hence, the individual transistors are interconnected by means of an aluminum conductor pattern which is provided by vacuum evaporation or sputtering. As the dimensions become smaller (submicron technology), sputtering or vacuum evaporation of, for example, aluminum is unsuitable for the metallization of contact holes because the step coverage of such processes is insufficient to fill up the holes. A suitable method is formed by electroless metallization in which metal is selectively separated from an aqueous solution of metal ions and a reducing agent and deposited in the contact holes.

A method of the type mentioned above is known from U.S. Pat. No. 5,017,516. In the method described therein, contact holes are etched by means of reactive ion etching (RIE) after which the bottom of the contact hole is nucleated with Pd. For the nucleation process, use is made of an aqueous solution containing HF and $PdCl_2$. The formation of Pd is the result of an exchange reaction between the noble Pd and the base Si of the bottom of the contact hole. The dielectric layer in which the contact holes are etched consists usually of $SiO_2$. Alternatively, other dielectric layers can be used such as $Si_3N_4$, "spin-on-glass" and synthetic resins such as polyimide. An exchange reaction between these dielectric materials and Pd does not take place, so that only the bottom of the contact hole is covered with Pd nuclei. Only the surfaces which are provided with Pd nuclei are metallized in an electroless metallization bath. The use of a very low $PdCl_2$ concentration (approximately 5 mg per liter) and a relatively high temperature (approximately 70° C.) of the nucleating solution enables contact holes of very small dimensions (diameter 1 μm) to be metallized because very many small Pd nuclei are formed at the bottom of the contact hole.

The subsequent metallization of the contact holes can be carried out using the customary electroless metallization baths such as those used for nickel, cobalt, gold, palladium, copper or alloys of these metals with other metals such as tungsten. In general, a nickel bath is used, preferably an alkali-free nickel bath. In certain subsequent process steps, the wafer is heated to a temperature of 450° C. It has been found that this may cause problems because the nickel of the plug reacts with the underlying silicon, thereby forming silicides. This results in a degradation of junctions and a very high contact resistance between the plug and the underlying silicon.

The known method cannot satisfactorily be used for the metallization of contact holes whose depths vary substantially. When relatively deep contact holes are fully metallized, the metal layer in less deep contact holes will grow beyond the dielectric layer. Due to lateral overgrowth of the metal along the surface of said dielectric layer, a short-circuit between adjacent plugs may occur.

It is an object of the invention to provide, inter alia, an improved method in which the formation of silicides is counteracted and which can also suitably be used to metallize contact holes whose depths vary substantially, without the occurrence of lateral overgrowth.

According to the invention, this object is achieved by a method as described above, which is characterized in that a stabilizer is added to the electroless metallization bath and in that, prior to the electroless metallization of the contact holes, the silicon of said contact holes is provided with a TiW layer, after which at least said TiW layer is provided with palladium nuclei. It has been found that TiW is capable of completely suppressing the reaction between the silicon substrate and the metal plugs (usually Ni), also at a temperature of 450° C. The TiW layer is provided at the bottom of the contact holes by sputtering or CVD, as will be described in the exemplary embodiment. The contact holes then comprise a TiW bottom and side walls of, for example, $SiO_2$. Subsequently, following the nucleation of the TiW with Pd, plugs can be grown on the TiW by means of an electroless metallization bath. In general, however, the TiW is covered with a persistent oxide layer which precludes a customary nucleating treatment. Said oxide layer can be removed by immersion in a concentrated aqueous KOH solution, after which a nucleating treatment using a diluted $PdCl_2$ solution, as described in the above-mentioned U.S. Pat. No. 5,017,516, can be carried out. Subsequently, the contact holes can be selectively filled using various electroless metallization baths such as, for example, a nickel bath.

Stabilizers are compounds which are added to an electroless metallization bath and which are capable of slowing down or completely suppressing the deposition of metal. In the metallization process, the bottom of a contact hole is subject to a smaller degree of mass transport of the stabilizer than the edge of the contact hole, so that the stabilizer concentration in the hole is lower than at the edge. The stabilizer concentration in the metallization bath is adjusted such that no metallization takes place at the edge of the contact hole, so that metallization stops automatically when the edge of the contact hole is reached. In this manner, contact holes of unequal depth are filled right up to the edge and the residence time of the wafers in the metallization bath is no longer critical.

An embodiment of the method according to the invention is characterized in that an organic sulphur compound is used as the stabilizer. A suitable compound is thiodiglycollic acid, but also other compounds can be used, such as those described in U.S. Pat. No. 3,234,031. The concentration used is very low and amounts to 0.1–50 mg per liter.

A suitable embodiment of the method according to the invention is characterized in that the palladium nuclei are provided by vacuum evaporating or sputtering a thin, discontinuous layer of palladium. During the vacuum evaporation or sputtering treatment of the wafer, not only are the contact holes provided with Pd nuclei but also the other surfaces, such as the surfaces of the dielectric layer, are so provided with Pd nuclei. It has been found that such a non-selective nucleating method nevertheless leads to a selective metallization of the contact holes with respect to the dielectric layer. A possible explanation could be that the Pd nuclei at the bottom of the contact hole consisting of TiW electrically contact each other, whereas the Pd nuclei on the dielectric layer are electrically insulated from each other. The stabilizers added to the metallization bath are capable of poisoning said insulated nuclei. If, however, said nuclei are electrically interconnected, as on the TiW, then they assist each other in initiating the metallization process and metallization takes place after all. When the electroless metallization bath contains no stabilizers, it is indeed found that both the metal (TiW) and the dielectric layer are metallized. Despite non-selective nucleation, the method according to the invention enables selective metallization.

The advantage of this manner of nucleating and subsequently metallizing is that the nucleation is homogeneous, i.e. the density of the nuclei is the same everywhere, which is not always achieved in the case of exchange nucleation using a palladium-salt solution. Besides, said method can also be used with electrically conductive substrate materials other than TiW. The oxide film on TiW is previously removed by sputter etching or by a treatment with an aqueous KOH solution. Next, Pd is provided by vacuum evaporation or sputtering. The Pd layer must be very thin to ensure that islands of Pd are formed instead of a continuous layer.

As an alternative, silicon-containing substrates, such as polysilicon and amorphous silicon, can be used instead of silicon substrates (n- and p-Si) referred to in the foregoing.

The method according to the invention can also be used to metallize via-holes, in which case the bottom of the contact hole consists of aluminum or a combination of aluminum and TiW.

The invention will be described in greater detail by means of an exemplary embodiment and with reference to the accompanying drawings, in which:

FIGS. 1a-1f diagrammatically show the process steps carried out to apply a TiW layer at the bottom of a contact hole; and FIGS. 2a-2d diagrammatically show the process steps carried out to fill contact holes having unequal depths.

EXEMPLARY EMBODIMENT 1

Figure 1B:
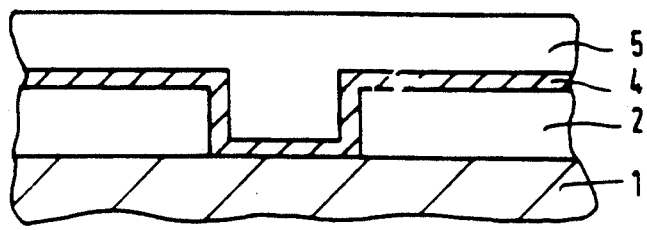
Figure 1C:
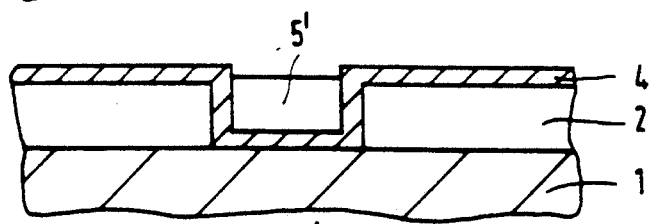
Figure 1D:
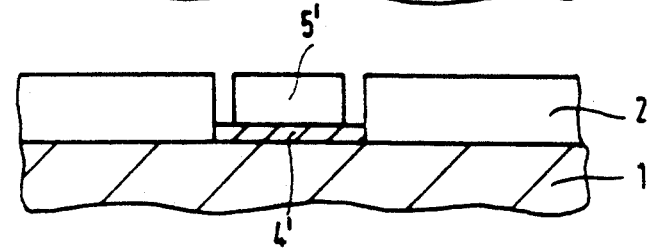
Figure 1E:
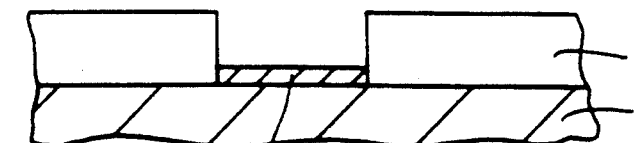

In FIG. 1a, reference numeral 1 denotes a part of a silicon substrate. A customary CVD process is used to apply a 0.7 μm thick layer 2 of $SiO_2$ to the silicon substrate, said layer being photolithographically provided with a contact hole 3 having a diameter of 1 μm. A 0.1 μm thick TiW layer 4 is sputtered on to the assembly, after which the TiW layer is coated with a positive photoresist layer 5 (FIG. 1b). Subsequently, the entire wafer is exposed to UV light in such a manner that the photoresist in the contact holes cannot be dissolved by the customary developing liquids. After developing, the situation as shown in FIG. 1c is obtained in which photoresist 5' is present in the contact hole. Next, the TiW is subjected to a wet-chemical etching treatment using diluted nitric acid, as a result of which TiW 4' remains at the bottom of the contact hole (FIG. 1d). The photoresist 5' is removed by etching in an oxygen plasma (FIG. 1e). After etching the oxide film on the TiW with an aqueous solution of KOH (1 molar), said TiW is nucleated with Pd in an aqueous solution of 70° C. for 1 minute. Said nucleating solution has the following composition:

5 mg of $PdCl_2$ per liter
175 μl of HCl (36% by weight) per liter
1% by weight of HF.

Figure 1F:
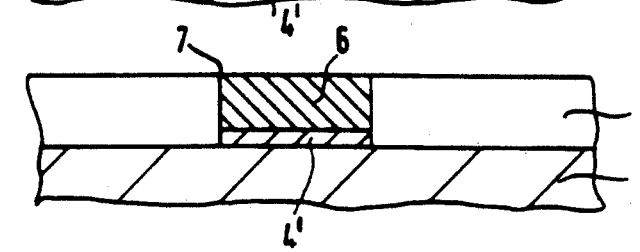

After rinsing with water, a plug 6 is grown in an electroless nickel bath (FIG. 1f). The growth process stops automatically when the edge 7 of the contact hole is reached.

The electroless nickel bath has the following composition per liter of water:

4.3 g of nickel acetate
15.7 g of nickel sulphate
11.7 g of succinic acid
15 g of $H_3PO_2$ (50% by weight in water)
1 mg of thiodiglycollic acid.

EXEMPLARY EMBODIMENT 2

Figure 2A:
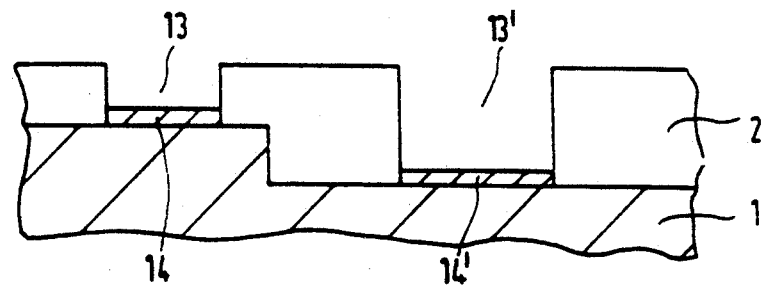
Figure 2B:
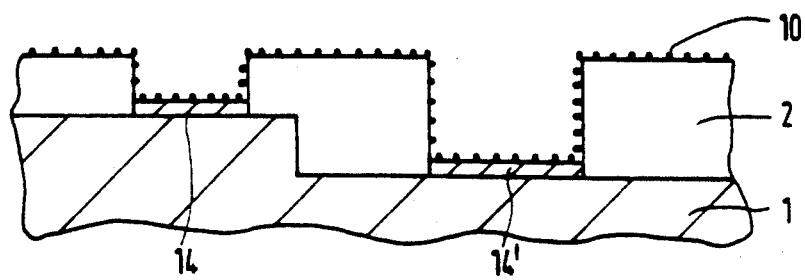
Figure 2C:
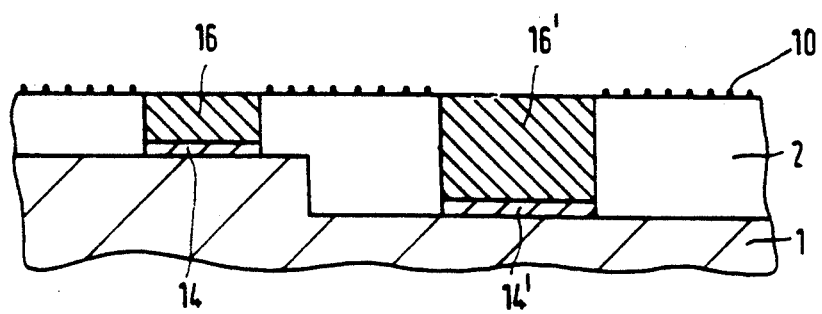
Figure 2D:
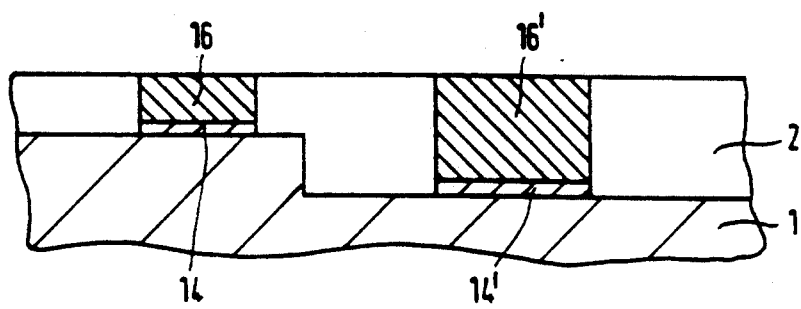

FIG. 2a diagrammatically shows a cross-sectional view of a part of a semiconductor device having contact holes 13 and 13' of unequal depth. Reference numeral 1 denotes the silicon substrate, reference numeral 2 denotes the $SiO_2$ layer and reference numerals 14 and 14' denote the TiW layers at the bottom of the contact holes. The TiW layers are obtained as described in exemplary embodiment 1. The TiW is rendered oxide-free by sputter etching, after which a Pd layer 10 (FIG. 2b) is provided on the entire surface of the wafer by vacuum evaporation. This Pd layer is a thin, discontinuous layer which consists of islands of Pd (nuclei). The Pd nuclei on the TiW layers 14 and 14' electrically contact each other. Following the nickel-plating process in an electroless nickel bath using a stabilizer in accordance with exemplary embodiment 1, the contact holes are selectively filled with nickel plugs 16 and 16' right up to the edge (FIG. 2c). Despite the presence of Pd nuclei, no deposition of nickel takes place on the surface of the $SiO_2$. If desired, said Pd nuclei can be removed by sputter etching (FIG. 2d).

By virtue of the presence of a TiW layer between the nickel plug and the silicon substrate, the formation of silicides during an annealing treatment at 450° C. is precluded.

We claim:

1. A method of manufacturing a semiconductor device comprising a silicon substrate and a dielectric layer which is provided thereon and in which contact holes are etched down to the silicon, after which palladium nuclei are provided in the contact holes and, next, metal plugs are formed in said contact holes by means of an electroless metallization bath, which plugs contact the silicon, characterized in that a stabilizer is added to the electroless metallization bath and in that, prior to the electroless metallization of the contract holes, the silicon of said contact holes is provided with a TiW layer, after which at least said TiW layer is provided with palladium nuclei.

2. A method as claimed in claim 1, characterized in that an organic sulphur compound is used as the stabilizer.

3. A method as claimed in claim 1, characterized in that the palladium nuclei are provided by means of a thin, discontinuous layer of palladium obtained by vacuum evaporation or sputtering.

4. A method as claimed in claim 1, characterized in that contact holes of unequal depth are used and are filled completely with metal, thereby forming plugs of unequal height.

* * * * *